United States Patent
Duan (10) Patent No.: US 9,602,226 B2
(45) Date of Patent: Mar. 21, 2017

(54) DISTRIBUTED SPECTRUM ANALYZER AND METHOD OF SPECTRUM ANALYSIS APPLYING SAME

(71) Applicant: DATANG MOBILE COMMUNICATIONS EQUIPMENT CO., LTD, Beijing (CN)

(72) Inventor: Tao Duan, Beijing (CN)

(73) Assignee: DATANG MOBILE COMMUNICATIONS EQUIPMENT CO., LTD, Beijing (CN)

( * ) Notice: Subject to any disclaimer, the term of this patent is extended or adjusted under 35 U.S.C. 154(b) by 0 days.

(21) Appl. No.: 14/401,838

(22) PCT Filed: Nov. 23, 2012

(86) PCT No.: PCT/CN2012/085149
§ 371 (c)(1),
(2) Date: Nov. 17, 2014

(87) PCT Pub. No.: WO2013/185436
PCT Pub. Date: Dec. 19, 2013

(65) Prior Publication Data
US 2015/0133060 A1 May 14, 2015

(30) Foreign Application Priority Data
Jun. 12, 2012 (CN) .......................... 2012 1 0191959

(51) Int. Cl.
*H04B 17/00* (2015.01)
*H04B 17/20* (2015.01)
(Continued)

(52) U.S. Cl.
CPC ............. *H04B 17/20* (2015.01); *G01R 23/17* (2013.01); *G01R 33/3621* (2013.01)

(58) Field of Classification Search
CPC ...... H04W 24/08; H04W 24/10; H04W 24/06
(Continued)

(56) References Cited

U.S. PATENT DOCUMENTS 5,898,693 A 4/1999 Vecchi et al.
6,308,085 B1 * 10/2001 Shoki ..................... H04B 7/024
455/273

(Continued)

FOREIGN PATENT DOCUMENTS

CN 1450741 A 10/2003
CN 1476678 A 2/2004
(Continued)

OTHER PUBLICATIONS

CATT: "Introduction of TA+AOA position method in stage 2 spec", 3GPP Draft, R2-093765, Mobile Competence Centre, 650, Route Des Lucioles, F-06921 Sophia-Antipolis Cedex, Jun. 23, 2009, XP050351993.

(Continued)

*Primary Examiner* — Alejandro Rivero
*Assistant Examiner* — Angelica M Perez
(74) *Attorney, Agent, or Firm* — Gokalp Bayramoglu (57) ABSTRACT

A distributed spectrum analyzer and a method of spectrum analysis applying same. The spectrum analyzer adopts a separate design. A radio frequency receiver receives a signal, performs frequency conversion processing and AD conversion on the received signal, and sends the converted digital signal to a host. In such a structure, by a digital optical module, the radio frequency receiver is connected to a corresponding digital optical module on the host through an optical fiber, so as to implement a bidirectional data transmission. The host performs general control of the system as well as signal processing and spectrum analysis. Therefore, a multi-interface design is applied to the host of the spectrum (Continued)

analyzer, so as to support simultaneous access and control for a plurality of radio frequency receivers, thereby conveniently implementing multi-port measurement extension.

10 Claims, 5 Drawing Sheets

(51) Int. Cl.
*G01R 23/17* (2006.01)
*G01R 33/36* (2006.01)

(58) Field of Classification Search
USPC ... 455/67.11, 3.01, 3.03; 398/66, 71, 72, 73, 398/74
See application file for complete search history.

(56) References Cited

U.S. PATENT DOCUMENTS

| | | | |
|---|---|---|---|
| 7,378,844 B2 * | 5/2008 | Watkins et al. | 324/304 |
| 2007/0207759 A1 | 9/2007 | Vavelidis et al. | |
| 2008/0175210 A1 * | 7/2008 | Jamieson | H04W 24/10 370/338 |
| 2009/0170528 A1 | 7/2009 | Bull et al. | |
| 2010/0115437 A1 | 5/2010 | Engel et al. | |
| 2010/0117624 A1 | 5/2010 | Carroll et al. | |
| 2010/0244840 A1 * | 9/2010 | McKinnon | 324/322 |
| 2010/0259261 A1 * | 10/2010 | Saes et al. | 324/309 |
| 2012/0009937 A1 | 1/2012 | Daly | |
| 2012/0020397 A1 | 1/2012 | Estrada et al. | |

FOREIGN PATENT DOCUMENTS

| | | |
|---|---|---|
| CN | 1749766 A | 3/2006 |
| CN | 1828329 A | 9/2006 |
| CN | 2872749 Y | 2/2007 |
| CN | 101382587 A | 3/2009 |
| CN | 101688906 A | 3/2010 |
| CN | 102412916 A | 4/2012 |
| CN | 102749511 A | 10/2012 |
| EP | 0573097 A1 | 12/1993 |
| EP | 2398290 A1 | 12/2011 |
| JP | 4-168373 A | 6/1992 |
| JP | H09305430 A | 11/1997 |
| JP | H11264736 A | 9/1999 |
| JP | 2000131356 A | 5/2000 |
| JP | 2000286902 A | 10/2000 |
| JP | 200633735 A | 2/2006 |
| JP | 2008111832 A | 5/2008 |
| JP | 2011107145 A | 6/2011 |
| KR | 2001-0028017 A | 4/2001 |

OTHER PUBLICATIONS

Claudio A. Ardagna et al: "Supporting Location-Based Conditions in Access Control Policies", Mar. 21, 2006, pp. 212~222, XP055044682.

* cited by examiner

DISTRIBUTED SPECTRUM ANALYZER AND METHOD OF SPECTRUM ANALYSIS APPLYING SAME

This application claims priority from Chinese Patent Application No. 201210191959.9, titled "Distributed spectrum analyzer and method of spectrum analysis applying same", filed on Jun. 12, 2012.

TECHNICAL FIELD

The present application relates to communication technology field, and in particular to a distributed spectrum analyzer and method of spectrum analysis applying same.

BACKGROUND ART

A spectrum analyzer is an instrument for studying the spectrum structure of an electrical signal, and is a multi-function electronic measuring instrument that is used to measure parameters such as signal distortion, modulation degree, spectral purity, frequency stability and intermodulation distortion, and may be used to measure some parameters of a circuitry system such as an amplifier and a filter.

Figure 1:
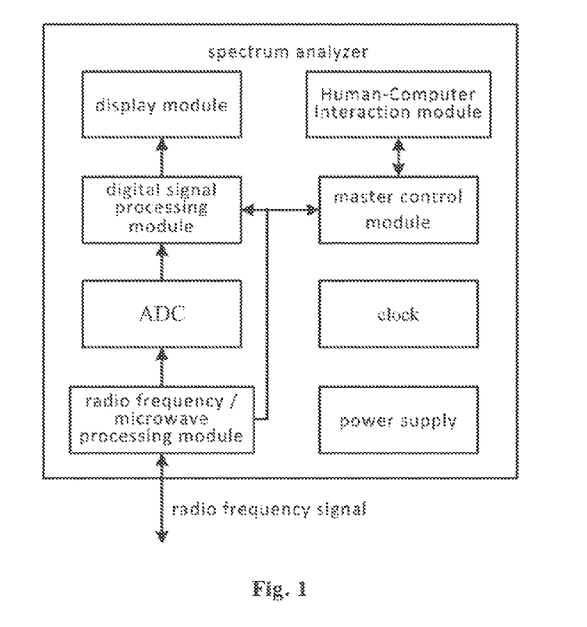
FIG. 1 is a schematic block diagram of a spectrum analyzer in the prior art.

As shown in FIG. 1, there is a schematic block diagram of a spectrum analyzer in the prior art. The hardware of various parts generally included in a current spectrum analyzer will be described below.

Frequency of the spectrum analyzer typically ranges from kHz to GHz magnitude. By several down-conversions, usually, a radio frequency/microwave signal would be changed to a frequency which could be sampled by an ADC (Analog to Digital Converter). The functional circuit which can realize above operation is a radio frequency/microwave processing module.

The down-converted analog signal may be sampled by the ADC to achieve an analog-to-digital conversion. IQ data output by the ADC may be sent to a digital signal processing module for analysis and processing, and then a display module may convert the data to graph curves and display it on a screen.

An operator may operate the instrument by a panel menu. A Human-Computer Interaction module may transform these operations into control commands. A master control module may perform parameter setting and processing control for each functional circuit of the instrument, so as to complete a test and data processing required by the operator.

A clock and a power supply are two necessary hardware components in the instrument, mainly provide a clock and supply power for the interior circuits of the instrument.

During the implementation of the present application, the inventor has found at least the following problems in the prior art:

The existing spectrum analyzer has following disadvantages due to a single chassis design as a whole:
1. The frequency band supported by the instrument is fixed.
2. The measurement port supported by the instrument is fixed, and generally only one measurement port is supported.
3. Due to a relatively large volume and weight, it is not convenient for a test in a special circumstance (for example, equipment on a control tower, etc.).

SUMMARY OF THE INVENTION

The embodiment of the present application provides a distributed spectrum analyzer and a method of spectrum analysis applying the same, so as to solve the problems of performing spectrum analysis and measurement on a fixed frequency band only through a single port by the spectrum analyzer in the prior art and limiting application circumstances.

To achieve the above object, according to one aspect, the embodiment of the present application provides a distributed spectrum analyzer, at least comprising a host and one or more radio frequency receivers:

the radio frequency receiver being configured to receive a radio frequency signal, perform frequency conversion processing and AD conversion on the radio frequency signal, and send an AD-converted digital signal to the host by a digital optical module through an optical fiber;

the host including a digital signal processing module and one or more digital optical modules, each of the digital optical modules being configured to connect to one of the radio frequency receivers through the optical fiber and receive the AD-converted digital signal sent by the radio frequency receiver, and the digital signal processing module being configured to process the received AD-converted digital signal.

According to another aspect, the embodiment of the present application provides a method of spectrum analysis applying a distributed spectrum analyzer, comprising:

deploying radio frequency receivers having corresponding types at various radio frequency signal sources to be analyzed, respectively;

connecting each of the radio frequency receivers to a corresponding type of digital optical module in a host through an optical fiber, respectively; and starting the host and the corresponding radio frequency receivers and inputting an operation instruction, in order that the host receives an AD-converted digital signal sent by the radio frequency receivers and performs a spectrum analysis processing.

Compared with the prior art, the technical solution proposed in the embodiment of the present application has following advantages:

By applying the technical solution according to the embodiment of the present application, the spectrum analyzer adopts a separate design. The radio frequency receiver receives a signal, performs frequency conversion processing and AD conversion on the received signal, and sends the converted digital signal to the host. In such a structure, h a digital optical module, one or more radio frequency receivers are connected to a respective digital optical module on the host through an optical fiber, so as to implement bidirectional data transmission. The host performs general control of the system as well as signal processing and spectrum analysis. Therefore, a multi-interface design is applied to the host of the spectrum analyzer, so as to support simultaneous access and control for a plurality of radio frequency receivers, thereby conveniently implementing multi-port measurement extension. Also, the radio frequency receiver has low power consumption, a small volume, and a light weight, and is connected to a host by adopting a digital optical fiber. The host and the radio frequency receiver can be arranged at a distance up to tens of kilometers, so as to implement local measurement and installation and remote control and processing, thereby meeting various special demands.

DETAILED DESCRIPTION OF EMBODIMENTS

As described in the background art, the current spectrum analyzer is generally integrated in such a manner that radio frequency receiving, signal processing, human-machine operation and screen display are all amounted in a chassis structure, therefore the current spectrum analyzer only support a predetermined frequency band and a measurement channel.

To overcome such drawbacks, the embodiment of the present application proposes a distributed spectrum analyzer. The distributed spectrum analyzer is divided into two parts, namely a radio frequency receiver and a host. The radio frequency receiver receives a signal, performs frequency conversion processing and AD conversion on the received signal, and sends the converted digital signal to the host to perform signal processing and spectrum analysis. In this structure, the host of the spectrum analyzer applies a multi-interface design, may support simultaneous access and control for a plurality of radio frequency receivers. Therefore, the problems of performing spectrum analysis and measurement on a fixed frequency band only through a single port by the spectrum analyzer in the prior art and limiting the application circumstances may be solved.

Figure 2:
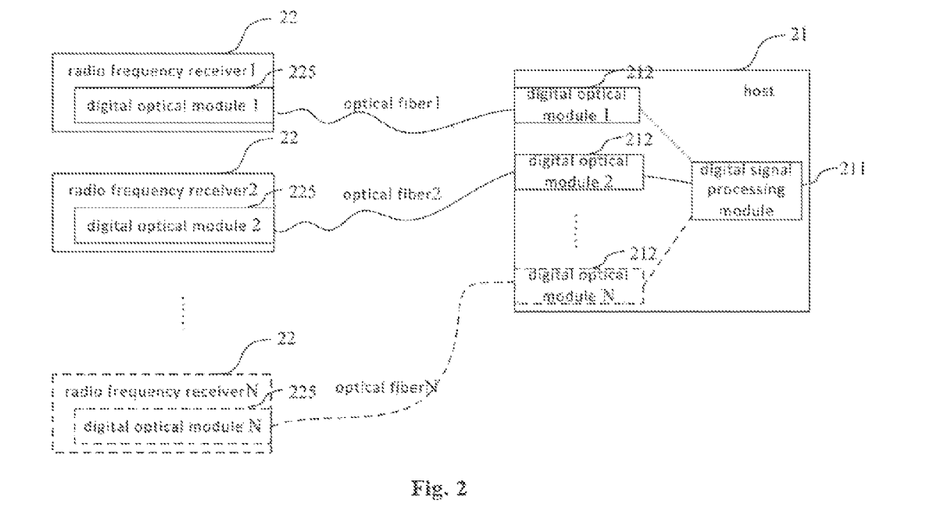
FIG. 2 is a schematic block diagram of a distributed spectrum analyzer according to the embodiment of the present application.

FIG. 2 is a schematic block diagram of a distributed spectrum analyzer according to the embodiment of the present application. The distributed spectrum analyzer at least comprises a host 21 and one or more radio frequency receivers 22. In practice, the minimum configuration of the distributed spectrum analyzer requires a host 21 and a radio frequency receiver 22.

A radio frequency receiver 1, a radio frequency receiver 2 . . . a radio frequency receiver N as show in FIG. 2 are specifically N radio frequency receivers 22 included in the distributed spectrum analyzer. Modules and components shown in broken lines in the Figures may be extended as required.

The various components of the distributed spectrum analyzer will be described in detail hereinafter.

The radio frequency receivers 22 may be configured to receive a radio frequency signal from a radio frequency source (in practice, due to the difference in signal sources, a microwave signal may be received; however, this only refers to the change in the type of the signal and does not affect the subsequent technical solution proposed in the embodiments of the present application and the protection scope of the present application), perform gain control, frequency conversion and filtering processing and AD (Analog to Digital) conversion on the radio frequency signal, and transmit an AD-converted digital signal to the host 21 by a digital optical module 225 through an optical fiber.

In the embodiment of the present application, the number of radio frequency receivers 22 may particularly be one or more and deployed according to the radio frequency source needed to be measured and analyzed. The distance from the deployment position of the radio frequency receivers to the host 21 may be adjusted based on the deployment length of the optical fiber, which can reach as long as tens of kilometers. As a result, a problem, in which the integrated spectrum analyzer in the prior art has to be deployed on a site to which the radio frequency source is directly connected so as to perform measurement and analysis, may be overcome, thereby providing more flexible and convenient operations on the radio frequency measurement and analysis.

Figure 3:
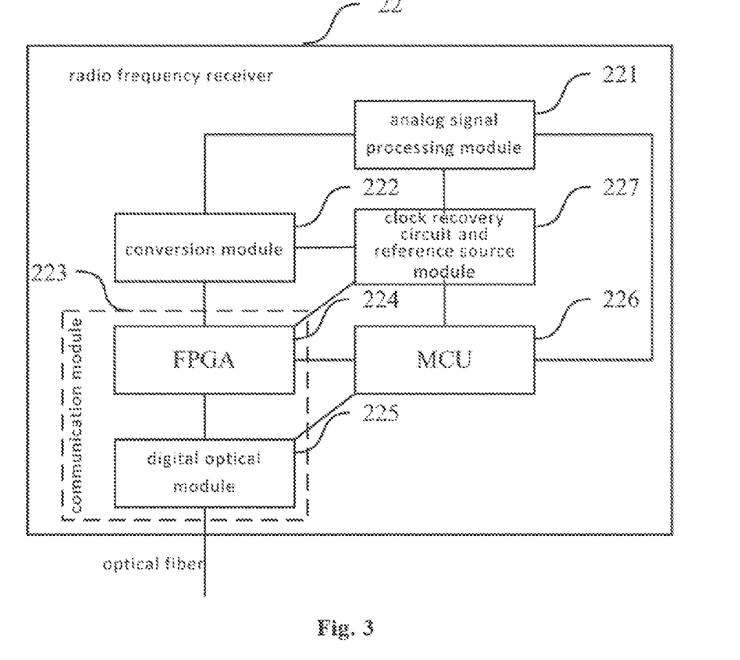
FIG. 3 is a schematic block diagram of a radio frequency receiver in the distributed spectrum analyzer according to the embodiment of the present application.

FIG. 3 is a schematic block diagram of a radio frequency receiver in the distributed spectrum analyzer according to the embodiment of the present application. The radio frequency receiver particularly includes the following modules:

An analog signal processing module 221 may be configured to receive a radio frequency/microwave signal, perform gain control, frequency conversion and filtering processing on the radio frequency/microwave signal, and output a corresponding analog intermediate frequency signal, wherein, the rule and manner of the frequency conversion processing may depend on the sampling frequency range of a conversion module 222, and a final effect of the frequency conversion processing by the analog signal processing module 221 is to convert the frequency of the received signal to a frequency range which can be sampled by the conversion module 222, so as to proceed to subsequent processing; after reaching a corresponding effect of frequency conversion, the analog signal processing module 221 transmits a frequency-converted analog, intermediate frequency signal to the conversion module 222; it should be explained that the analog signal processing, module 221 may perform the frequency conversion processing for one or more times in this process and the change in specific times of the frequency conversion processing will not affect the protection scope of the present application.

A conversion module 222 may be configured to perform an AD conversion processing on the analog intermediate frequency signal frequency-converted by the analog signal processing module 221 and output a corresponding digital signal. In consideration that a final processing signal of the spectrum analyzer should be a digital signal, the corresponding AD conversion operation is performed by the conversion module 222 in the radio frequency receiver 22. A specific rule of the conversion operation can be adjusted according to a specific type of the radio frequency signal source deployed by the radio frequency receiver 22.

A communication module 223 may be configured to transmit a digital signal AD-converted by the conversion module 222 to the host 21 through the optical fiber; the communication module takes a role in forwarding the digital signal.

In a specific processing circumstance, the communication module 223 may consist of a FPGA (Field-Programmable Gate Array) 224 and a digital optical module 225.

The FPGA 224 may be configured to control a timing sequence for the analog signal processing module 221 and forward the digital signal AD-converted by the conversion module 222 to the digital optical module 225.

The digital optical module 225 may be configured to transmit the digital signal forwarded by the FPGA 224 to the host 21 through the optical fiber.

Further, the digital optical module 225 is required to perform the processing in the following two aspects in a specific circumstance:

(1) A control information transmission from the host 21 to the radio frequency receiver 22

The digital optical module 225 may receive a digital optical signal including a clock signal, a control instruction and data information sent by the host 21 by the optical fiber, convert it into a digital electrical signal, and forward the digital electrical signal to the FPGA 224, such that the FPGA 224 controls the timing sequence for the analog signal processing module 221 according to an analysis result of the digital electrical signal.

By the above processing, the host 21 and the radio frequency receiver 22 may interact signals including clock information by the optical fiber, and according to a predetermined process and a predefined protocol, the clock of the radio frequency receiver 22 is locked to the clock of the host 21, thereby ensuring. the consistency of their clock information during the spectrum analysis and measurement and ensuring the accuracy of a spectrum analysis result.

(2) A signal transmission from the radio frequency receiver 22 to the host 21

The digital optical module 225 may receive the digital electrical signal forwarded by the FPGA, combine the electrical digital signal with local management information to be packed into a frame in a predetermined format, convert the digital electrical signal to a digital optical signal and transmit it to the host 21 by optical fiber.

It should be noted that the optical fiber transmission protocol between the host 21 and the radio frequency receiver 22 can be defined as necessary in practice, and as long as a normal communication of the optical fiber can be ensured, the embodiment of the present application does not concern the changes in specific protocol rules, so the detailed description thereof will be omitted.

On the other hand, in order to realize the control of the radio frequency receiver 22, and especially in 1 case that the host 21 and the radio frequency receiver 22 are arranged at a relatively long distance, in order to realize the remote operation and adjustment of the radio frequency receiver 22, there is a need to establish a corresponding control mechanism between the host 21 and the radio frequency receiver 22. Therefore, in such an application circumstance, the radio frequency receiver 22 may further include the following processing units:

An MCU (Micro Control Unit) 226 may be configured to perform configuration loading and fault management on the FPGA 224 and various circuits and other modules inside the radio frequency receiver 22 according to a control command and data information received by the digital optical module 225. This processing unit is used to perform corresponding control and configuration processing on the radio frequency receiver 22 according to the control command and data information transmitted from the host 21.

A clock recovery circuit and reference source module 227 may be configured to perform recovery and debounce on the clock signal forwarded by the FPGA 224, provide a local reference signal which is synchronous with the clock signal of the host 21 for the analog signal processing module 221, and provide a sampling clock for the conversion module 222.

by the above processing, the clock recovery circuit and reference source module 227 may interact and synchronize the clock information of the host 21 with the relevant modules in the radio frequency receiver 22, so that the various modules can perform corresponding processing according to the clock information of the host 21, and the clock of the radio frequency receiver 22 can be locked to the clock of the host 21, thereby ensuring the consistency of their clock information during the spectrum analysis and measurement and ensuring the accuracy of the spectrum analysis result.

As shown in FIG. 2, the host 21 includes a digital signal processing module 211, and one or more digital optical modules 212.

Herein, each of the digital optical modules 212 can be configured to connect to one of the radio frequency receivers 22 through the optical fiber and receive the AD-converted digital signal sent by the radio frequency receiver 22; the digital signal processing module 211 can be configured to process the received AD-converted digital signal.

It should be noted that the number of digital optical modules 212 deployed in the host 21 can be adjusted according to the number of the radio frequency receivers 22 needed to be accessed. Thus, a plurality of radio frequency receivers 22 can be connected to the host 21 at the same time, so as to directly switch the radio frequency receivers 22 when the analysis and measurement on different frequency sources are needed to be performed. Accordingly, the problem of measurement and analysis only for a fixed frequency through a single interface in the prior art can be overcome.

In a specific circumstance, the above one or more radio frequency receivers 22 particularly may be radio frequency receivers with a same type, or radio frequency receivers with different types (adjustable according to radio frequency sources).

Figure 4:
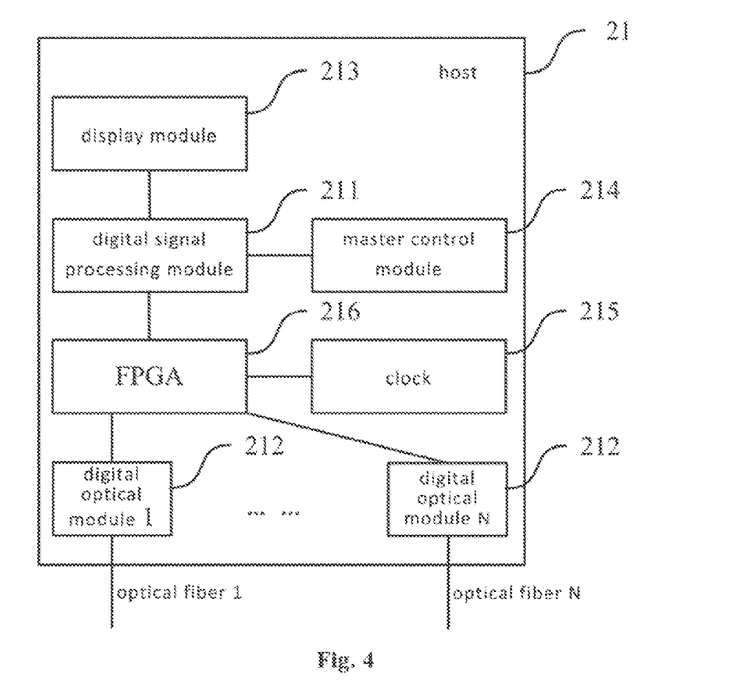
FIG. 4 is a schematic block diagram of a host in the distributed spectrum analyzer according to the embodiment of the present application.

FIG. 4 is a schematic block diagram of a host in the distributed spectrum analyzer according to the embodiment of the present application. The host particularly includes the following modules:

A digital signal processing module 211 takes a role similar to the digital signal processing module in the prior art, and is configured to perform analysis processing on a digital signal.

A digital optical module 212 may be configured to connect to one of the radio frequency receivers 22 by the optical fiber. In a specific processing circumstance, one digital optical module 212 is connected to only one of the radio frequency receivers 22 by the optical fiber, thereby ensuring that various signals transmitted by the radio frequency receivers 22 cannot interfere with each other. Besides, the host 21 can invoke different radio frequency receivers 22 (i.e., acquire signals of different radio frequency sources) directly by switching or enabling the corresponding digital optical module 212, and moreover avoiding mutual interference of signals by interface isolation in the specific measurement and analysis process, thereby overcoming the problems that the spectrum analyzer in the prior art can only measure a single frequency and complicatedly changes the frequency.

It should be noted that, according to the difference in specific outputting manners for the data result analysis processed by the digital signal processing module 211, the structure of the host 21 may be varied accordingly.

On one hand, the digital signal processing module 211 may directly export data information corresponding to the analysis result and exhibit it to a corresponding operator. For example, the data information may be output to an external terminal device (e.g., a computer) and saved as a corresponding file or displayed through a displayer of the terminal device, or the corresponding result may be directly printed to present on a corresponding report list.

On the other hand, the host 21 may additionally include a display module 213, which is configured to convert the processing result of the digital signal AD-converted by the digital signal processing module 211 to a graph and display the same.

The specific outputting manners of the analysis processing result as discussed above can be set according to practical demands. The change in outputting manner does not affect the scope of the present application.

In a specific application circumstance, in order to conform to the aforementioned circumstance of remotely controlling the radio frequency receiver 21, the host 21 may further include the following modules:

A master control module 214 may be configured to select the radio frequency receiver 22 needed to be enabled according to a received operation instruction (a specific operation instruction can be triggered by a control button on the host 21, or directly input by an external input device) and transmit a corresponding control command and data information to the digital signal processing module 211.

A clock 215 may be configured to output a clock signal.

An FPGA 216 may be connected to each of the digital optical modules 212, respectively, and be configured to transmit the control command and the data information forwarded by the digital signal processing module 211 and the clock signal output by the clock 215 to the digital optical module 212 corresponding to the radio frequency receiver 22 needed to be enabled (determined by the master control module 214). The digital optical module 212 may transmit the digital optical signal including the clock signal, the control command and the data information to a corresponding radio frequency receiver 22 through the optical fiber. The FPGA 216 may further configured to transmit the AD-converted digital signal forwarded by each of the digital optical modules 212 to the digital signal processing module 211 for processing.

Correspondingly, in order to apply the aforementioned distributed spectrum analyzer for spectrum analysis and testing process, an embodiment of the present application further proposes a corresponding processing solution.

Figure 5:
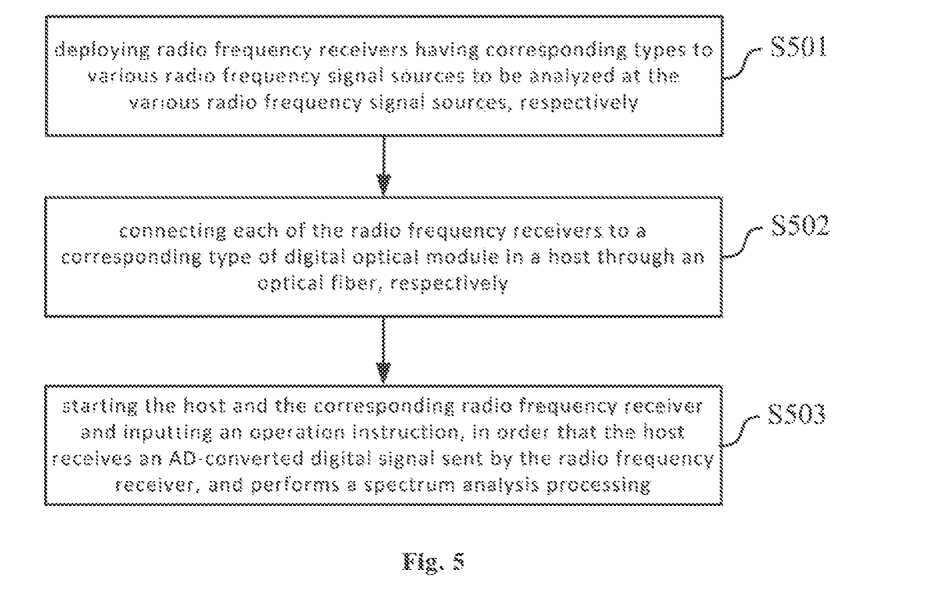
FIG. 5 is a schematic flow chart of a method of spectrum analysis applying the distributed spectrum analyzer according to the embodiment of the present application.

FIG. 5 is a schematic flow chart of a method of spectrum analysis applying the distributed spectrum analyzer according to the embodiment of the present application. The method particularly may include the following steps:

Step S501, deploying radio frequency receivers having corresponding types to various radio frequency signal sources to be analyzed at the various radio frequency signal sources, respectively.

Specifically, the number of deployed radio frequency receivers may particularly be one or more, and a corresponding deployment can be performed according to the radio frequency sources needed to be measured and analyzed.

Moreover, the type of deployed radio frequency receivers may be same or be different.

Step S502, connecting each of the radio frequency receivers to a corresponding type of digital optical module in a host through an optical fiber, respectively.

The distance from the deployment position of the radio frequency receiver to the host may be adjusted based on the deployment length of the optical fiber. As a result, the problem, in which the integrated spectrum analyzer in the prior art has to be deployed on a site to which the radio frequency source is directly connected so as to perform measurement and analysis, may be overcome, thereby providing more flexible and convenient operations on the radio frequency measurement and analysis.

Step S503, starting the host and the corresponding radio frequency receiver and inputting an operation instruction, in order that the host receives an AD-converted digital signal sent by the radio frequency receiver, and performs a spectrum analysis processing.

Specifically, after inputting the operation instruction in this step, the corresponding processes in the host are as follows:

(1) The host determines a radio frequency signal source to be analyzed on which spectrum analysis is needed to be performed currently, and selects a radio frequency receiver required to be started, according to the operation instruction.

The radio frequency receiver required to be started is selected according to a radio frequency point required to be measured. In the case that a plurality of radio frequency receivers having different types are deployed at one radio frequency point, a corresponding type of radio frequency receiver required to be started can be selected.

(2) The host transmits a digital optical signal including a clock signal, a control instruction and data information to the radio frequency receiver required to be started through the optical fiber, so as to achieve clock synchronization and control operations.

By this step, the host may perform corresponding control operations on a remote radio frequency receiver and achieve the corresponding clock synchronization.

(3) The host receives an AD-converted digital signal returned from the radio frequency receiver required to be started, performs the spectrum analysis processing, and transforms the corresponding processing result to a graph for display.

Compared with the prior art, the technical solution proposed in the embodiment of the present application has following advantages:

By applying the technical solution according to the embodiment of the present application, the spectrum analyzer adopts a separate design. The radio frequency receiver receives a signal, performs frequency conversion processing and AD conversion on the received signal, and sends the converted digital signal to the host. In such a structure, by a digital optical module, one or more radio frequency receivers are connected to a respective digital optical module on the host through an optical fiber, so as to implement bidirectional data transmission. The host performs general control of the system as well as signal processing and spectrum analysis. Therefore, a multi-interface design is applied for the host of the spectrum analyzer, so as to support simultaneous access and control for a plurality of radio frequency receivers, thereby conveniently implementing multi-port measurement extension. Also, the radio frequency receiver has low power consumption, a small volume, and a light weight, and is connected to a host by adopting a digital optical fiber. The host and the radio frequency receiver can be arranged at a distance up to tens of kilometers, so as to implement local measurement and installation and remote control and processing, thereby meeting various special demands.

Hereinafter, the technical solution proposed in the embodiment of the present application will be described in connection with a specific circumstance.

The purpose of providing a distributed spectrum analyzer in the embodiment of the present application is to solve the following problems in the existing spectrum instrument: the measurement frequency band is fixed, so it is inconvenient to change the frequency band; the measurement port is fixed, so it is not easy to expand; and the measurement, the signal processing and the control display are integrated.

In the technical solution proposed in the embodiment of the present application, the spectrum analyzer adopts a separate structure and the entire spectrum analyzer is divided into two parts: a radio frequency receiver and a host.

The distributed spectrum analyzer proposed in the embodiment of the present application has following structural characteristics:
(1) The radio frequency receiver is connected to the host via a digital optical fiber, is controlled by the host, performs frequency conversion processing and AD conversion on the radio frequency signal, and transmits the AD-converted digital signal to the host for subsequent processing.
(2) The host receives and processes the digital signal of the radio frequency receiver, and implements display and control of the system. One host can contain a plurality of digital optical modules and support simultaneous access for a plurality of radio frequency receivers, thereby conveniently implementing multi-port measurement extension.

By above-described structure configuration, when the spectrum analyzer is required to support different frequency bands or support the analysis of a plurality of radio frequency channels, it can be implemented by changing a radio frequency receiver having a different type and selectively downloading a corresponding measurement program at the host side, without having to changing, a spectrum analyzer having a different model or use multiple traditional spectrum analyzers. Therefore, it is possible to overcome the problem that the spectrum analyzer in the prior art can test only a single frequency band.

In the distributed spectrum analyzer proposed in the embodiment of the present application, the radio frequency receiver only has functions of radio frequency receiving and AD conversion, such that the power consumption, size and weight are much lower compared to the traditional integrated spectrum analyzer in the prior art. For a special measurement circumstance, the radio frequency receiver is easier to approach a device to be measured (i.e., the aforementioned radio frequency source), while the host can be placed farther away, so as to facilitate measurement and observation. Such a separate design can be easily used to measure and analyze in the special circumstance, and especially in the circumstance that an integrated spectrum analyzer is inconveniently to be carried, it is easier for measurement, deployment, operation and observation.

In the specific application circumstance, after starting the host and the radio frequency receiver, the signal is transmitted via the optical fiber, and according to a predetermined process and a predefined protocol, the clock of the radio frequency receiver is locked to the clock of the host. Upon the completion of the establishment of communication channels, remainder function operations are similar to those of a typical spectrum analyzer. An optical fiber transmission protocol between the host and the radio frequency receiver requires a special definition, so the description thereof will be omitted herein.

Figure 6:
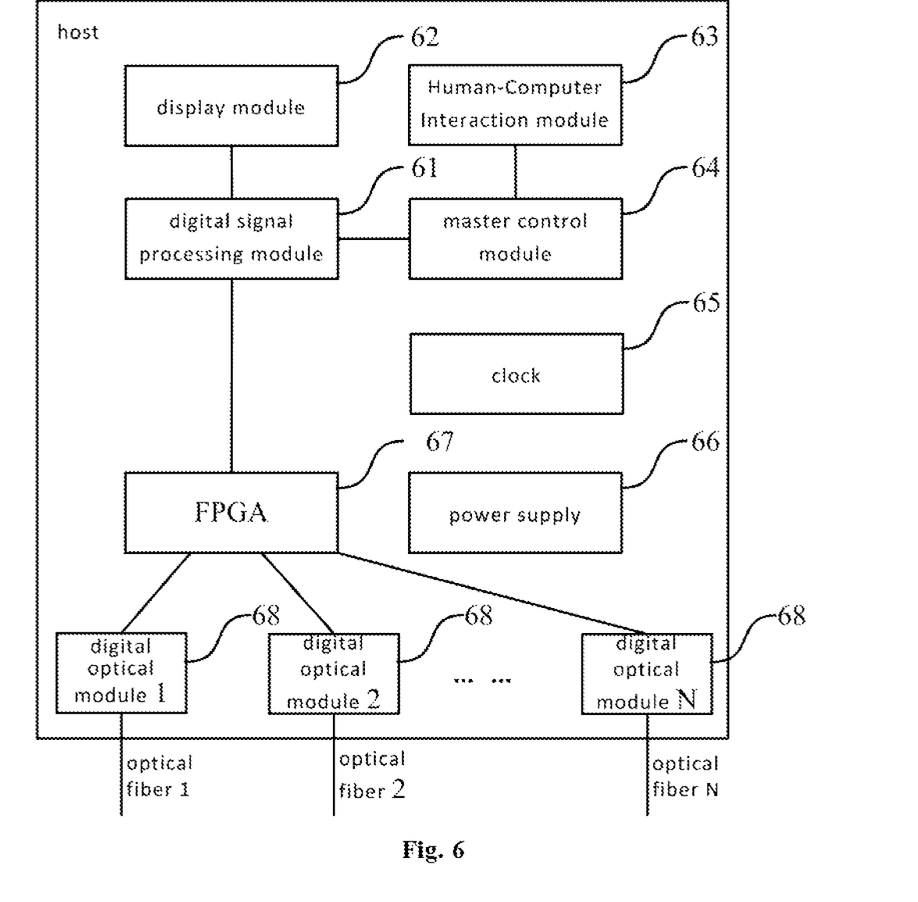
FIG. 6 is a schematic block diagram of the host part of the distributed spectrum analyzer in a specific application circumstance according to the embodiment of the present application.

FIG. 6 is a schematic block diagram of the host part of the distributed spectrum analyzer in a specific circumstance according. to the embodiment of the present application.

The function and construction of the host of the distributed spectrum analyzer is substantially the same as a typical spectrum analyzer in the prior art, except that the distributed spectrum analyzer dose not include a radio frequency circuit and ADC circuit of the typical spectrum analyzer.

Herein, a digital signal processing module 61 is configured to analyze and process the digital signal, a display module 62 is configured to convert a processing result of the digital signal processing module to a graph for display, a Human-Computer Interaction module 63 is configured to acquire an operation instruction (such as a key-press operation or a command input) on the host from an operator, a master control module 64 is configured to select a radio frequency receiver according to the operation instruction and generate a corresponding control command and data information, a clock 65 is configured to output clock signal, and a power supply 66 is configured to supply power for the host.

Meanwhile, in the distributed spectrum analyzer proposed in the embodiment of the present application, a FGPA 67 and a plurality of digital optical modules 68 are further provided as interface circuits, such that digital optical fiber interfaces to N radio frequency receivers may be realized and the plurality of digital optical modules may be configured according to the configurations of the radio frequency receivers needed to be accessed.

Figure 7:
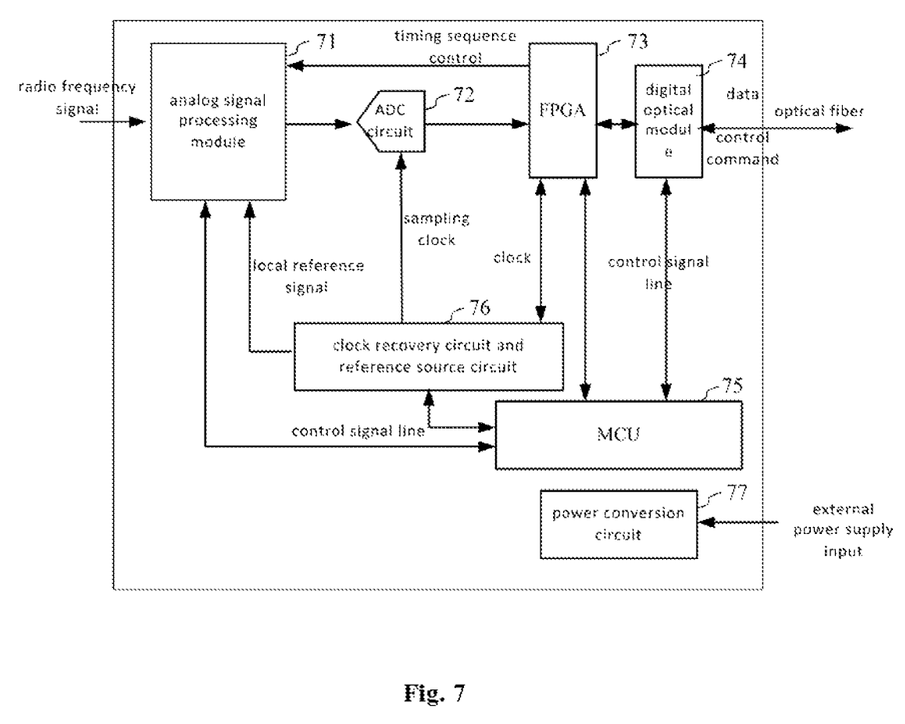
FIG. 7 is a schematic block diagram of the radio frequency receiver part of the distributed spectrum analyzer in a specific application circumstance according to the embodiment of the present application.

FIG. 7 is a schematic block diagram of the radio frequency receiver part of the distributed spectrum analyzer in a specific circumstance according to the embodiment of the present application.

A analog signal processing module 71 and an ADC circuit 72 in the radio frequency receiver have functions similar to the corresponding modules in the typical spectrum analyzer in the prior art, and implement frequency conversion processing and AD conversion of the radio frequency signals.

In order to achieve interaction with the host, the radio frequency receiver needs to be provided with an FGPA 73 and a digital optical module 74, which are configured to send the digital signal processed by the ADC circuit 72 to the host through the optical fiber.

Since the radio frequency receiver is independent of the host, in order to achieve functions of the receipt of remote host control and local maintenance management, a MCU 75 is needed to be provided to achieve the operation and maintenance management of the instrument. In a specific processing circumstance, the radio frequency receiver is required to be controlled by the host. Therefore, the corresponding control command and data information are received through the digital optical module 74 and then forwarded to the MCU 75. The MCU 75 configures various circuits inside the radio frequency receiver, completes the program loading of the FGPA 73 and the fault management of various units inside the radio frequency receiver based on this.

Further, in order to achieve a clock lock to the host by the radio frequency receiver, the FGPA 74 and the digital optical module 75 are also required to receive clock information and corresponding data transmitted by the host to achieve the control of a local state. A clock recovery circuit and local reference source circuit 76 are also disposed in the radio frequency receiver, so as to achieve the recovery and debounce of the clock signal transmitted from the optical fiber and to achieve the synchronization of the local reference source (which provides a local reference signal for the analog signal processing module 71) with the clock of the host (which provides a sampling clock for the ADC circuit), so that each module can perform corresponding processing in accordance with the clock information of the host. The clock of the radio frequency receiver is locked to the clock of the host, thereby ensuring the consistency of their clock information during spectrum analysis and measurement and ensuring the accuracy of the spectrum analysis result.

According to the above configuration, corresponding modules in the radio frequency receiver process the received radio frequency signals; the FGPA 73 and the digital optical module 74 combine the digital signal converted by the ADC circuit 72 with the local management information, pack it into a frame in a predetermined format, and transmit such a signal frame to the host by the optical fiber to perform digital signal processing and displaying by the host.

Further, since the radio frequency receiver is independent, a power conversion circuit 77 is necessarily provided to supply power for the radio frequency receiver via an external input power supply.

In practice, the radio frequency receiver derives a variety of types according to different specifications and functions (such as supported frequency band, bits of the ADC, etc.).

Compared with the prior art, the technical solution proposed in the embodiment of the present application has following advantages:

By applying the technical solution according to the embodiment of the present application, the spectrum analyzer adopts a separate design. The radio frequency receiver receives a signal, performs frequency conversion processing and AD conversion on the received signal, and sends the converted digital signal to the host. In such a structure, by a digital optical module, one or more radio frequency receivers are connected to a respective digital optical module on the host through an optical fiber, so as to implement bidirectional data transmission. The host performs general control of the system as well as signal processing and spectrum analysis. Therefore, a multi-interface design is applied to the host of the spectrum analyzer, so as to support simultaneous access and control for a plurality of radio frequency receivers, thereby conveniently implementing multi-port measurement extension. Also, the radio frequency receiver has low power consumption, a small volume, and a light weight, and is connected to a host by adopting a digital optical fiber. The host and the radio frequency receiver can be arranged at a distance up to tens of kilometers, so as to implement local measurement and installation and remote control and processing, thereby meeting various special demands.

Accordingly, the embodiment of the present application also provides a computer-readable recording medium on which a program for executing the method of spectrum analysis applying the distributed spectrum analyzer is stored.

The computer readable recording medium may include any mechanism which can be used to store and transmit information in a computing device (for example, a computer) readable form. For example, the machine-readable medium may include a Read Only Memory (ROM), a Random Access Memory (RAM), a magnetic disk storage media, an optical storage media, a flash memory media, and/or a propagation signal in electrical, optical, acoustical or other forms (e.g., carrier wave, infrared signal, digital signal, etc.).

By the above description of the embodiments, it should be clearly appreciated by the person skilled in the art that the present invention may be implemented by means of hardware or by means of software in connection with a required universal hardware platform. Based on this understanding, the embodiments of the present application may be embodied as a form of software product. The software product may be stored in a non-volatile storage medium (such as a CD-ROM, a USB flash disk, a mobile hard disk, etc.), including a plurality of instructions which could be used to execute the method as described in various circumstances according to the embodiments of the present application by a computer system (such as a personal computer, a server or network side equipment).

It should be appreciated by the person skilled in the art that the accompanying drawings are only schematic views of the preferred embodiments, and the modules or processes in the accompanying drawings are not necessarily required to implement the embodiments.

It should be appreciated by the person skilled in the art that the modules of the device in the embodiment may be disposed in the device of the embodiment as described herein, or may be changed accordingly to be positioned in one or more different devices from that in the embodiment. The modules in above embodiment can be combined in a single module or can be further divided into multiple modules.

The sequence numbers of the embodiments of the present application are only for the descriptive purpose but not intended to represent the relative merits of the embodiments.

Disclosed above are only specific circumstances according to the embodiment of the present application. However, the embodiment of the present application is not limited thereto. Any modifications which could be contemplated by the person skilled in the art will be fallen into the protection scope of the embodiment of the present application.

The invention claimed is:

1. A distributed spectrum analyzer, comprising: a host; at least one radio frequency receiver; wherein the at least one radio frequency receiver is configured to receive a radio frequency signal, perform frequency conversion processing and Analog to Digital (AD) conversion on the radio frequency signal, and send an AD-converted digital signal to the host by a first digital optical module through an optical fiber; wherein the host further comprises a digital signal processing module and at least one second digital optical module, each of the at least one second digital optical module being configured to connect to one of the at least one radio frequency receiver through the optical fiber and receive the AD-converted digital signal sent by the at least one radio frequency receiver, and the digital signal processing module being configured to process the received AD-converted digital signal wherein the host further comprises: a master control module, configured to select a radio frequency receiver needed to be enabled according to a received operation instruction and transmit a corresponding control command and data information to the digital signal processing module; a clock, configured to output a clock signal; and an FPGA, connected to each of the at least one second digital optical module, respectively, and configured to transmit the control command and the data information forwarded by the digital signal processing module and the clock signal output by the clock to the at least one second digital optical module corresponding to the radio frequency receiver needed to be enabled, the at least one second digital optical module transmitting the digital optical signal including the clock signal, the control command and the data information to a corresponding radio frequency receiver through the optical fiber, and further configured to transmit the AD-converted digital signal forwarded by each of the at least one second digital optical module to the digital signal processing module for processing.

2. The distributed spectrum analyzer according to claim 1, wherein the at least one radio frequency receiver comprises:
an analog signal processing module, configured to receive the radio frequency signal or a microwave signal, perform gain control, frequency conversion and filtering processing on the radio frequency signal or the microwave signal, and output a corresponding analog intermediate frequency signal;

a conversion module, configured to perform an AD conversion processing on the analog intermediate frequency signal frequency-converted by the analog signal processing module and output a corresponding AD-converted digital signal; and a communication module, configured to transmit the AD-converted digital signal converted by the conversion module to the host through the optical fiber.

3. The distributed spectrum analyzer according to claim 2, wherein the communication module consists of a first Field Programmable Gate Array (FPGA) and the first digital optical module:

the first FPGA being configured to control a timing sequence for the analog signal processing module and forward the digital signal AD-converted by the conversion module to the first digital optical module;

the first digital optical module being configured to transmit the digital signal forwarded by the first FPGA to the host through the optical fiber.

4. The distributed spectrum analyzer according to claim 3, wherein the first digital optical module is configured to:

receive a first digital optical signal including a clock signal, a control instruction and data information sent by the host through the optical fiber, convert it into a digital electrical signal, and forward the digital electrical signal to the first FPGA, such that the first FPGA controls the timing sequence to the analog signal processing module according to an analysis result of the digital electrical signal; and receive the digital electrical signal forwarded by the first FPGA, combine the digital electrical signal with local management information, pack it into a frame in a predetermined format, convert the digital electrical signal to a second digital optical signal and transmit it to the host through the optical fiber.

5. The distributed spectrum analyzer according to claim 4, wherein the at least one radio frequency receiver further comprises:

a micro control unit (MCU), configured to perform configuration loading and fault management on the first FPGA and various circuits and other modules inside the at least one radio frequency receiver according to a control command and data information received by the first digital optical module; and a clock recovery circuit and reference source module, configured to perform recovery and debounce on the clock signal forwarded by the first FPGA, provide a local reference signal which is synchronous with a clock signal of the host for the analog signal processing module, and provide a sampling clock for the conversion module.

6. The distributed spectrum analyzer according to claim 1, wherein the host further comprises:

a display module, configured to convert a processing result of the digital signal AD-converted by the digital signal processing module to graphs, and display it.

7. The distributed spectrum analyzer according to claim 1, wherein there are a plurality of radio frequency receivers and the plurality of radio frequency receivers are either the same type or different type.

8. A method of spectrum analysis applying a distributed spectrum analyzer, the method comprising the following steps: deploying a plurality of radio frequency receivers having corresponding types at various radio frequency signal sources to be analyzed, respectively; connecting each of the plurality of radio frequency receivers to a corresponding type of second digital optical module in a host through an optical fiber, respectively, wherein each of the plurality of radio frequency receivers is configured to receive a radio frequency signal, perform frequency conversion processing and Analog to Digital (AD) conversion on the radio frequency signal, and send an AD-converted digital signal to the host by a first digital optical module through an optical fiber: and starting the host and the plurality of radio frequency receivers and inputting an operation instruction, in order for the host to receive the AD-converted digital signal sent by the plurality of radio frequency receivers and perform a spectrum analysis processing signal wherein the host further comprises: a master control module, configured to select a radio frequency receiver needed to be enabled according to a received operation instruction and transmit a corresponding control command and data information to the digital signal processing module; a clock, configured to output a clock signal; and an FPGA, connected to each of the at least one second digital optical module, respectively, and configured to transmit the control command and the data information forwarded by the digital signal processing module and the clock signal output by the clock to the at least one second digital optical module corresponding to the radio frequency receiver needed to be enabled, the at least one second digital optical module transmitting the digital optical signal including the clock signal, the control command and the data information to a corresponding radio frequency receiver through the optical fiber, and further configured to transmit the AD-converted digital signal forwarded by each of the at least one second digital optical module to the digital signal processing module for processing.

9. The method according to claim 8, wherein, after the step of starting the host and the plurality of radio frequency receivers and inputting the operation instruction, the method further comprises:

determining a radio frequency signal source to be analyzed on which spectrum analysis is needed to be performed currently, and selecting a radio frequency receiver required to be enabled, by the host according to the operation instruction;

transmitting a digital optical signal including a clock signal, a control instruction and data information to the radio frequency receiver required to be enabled by the host through the optical fiber, so as to achieve clock synchronization and control operations; and receiving an AD-converted digital signal returned from the radio frequency receiver required to be enabled, performing the spectrum analysis processing, and transforming a corresponding processing result to a graph for display by the host.

10. The method according to claim 9, further comprising a non-transitory computer readable recording medium having a program stored thereon for executing the method.

* * * * *